United States Patent
Heinrich et al.

(10) Patent No.: US 8,337,681 B2
(45) Date of Patent: Dec. 25, 2012

(54) ENDBLOCK FOR A MAGNETRON DEVICE WITH A ROTATABLE TARGET

(75) Inventors: Hans-Juergen Heinrich, Grossroehrsdorf (DE); Ulf Seyfert, Dresden (DE); Goetz Teschner, Dresden (DE)

(73) Assignee: Von Ardenne Anlagentechnik GMGH, Dresden (DE)

( * ) Notice: Subject to any disclaimer, the term of this patent is extended or adjusted under 35 U.S.C. 154(b) by 288 days.

(21) Appl. No.: 12/621,144

(22) Filed: Nov. 18, 2009

(65) Prior Publication Data

US 2010/0126855 A1    May 27, 2010

(30) Foreign Application Priority Data

Nov. 21, 2008  (DE) .................. 10 2008 058 528

(51) Int. Cl.
   *C23C 14/34* (2006.01)

(52) U.S. Cl. .................. 204/298.21; 204/298.22

(58) Field of Classification Search ............. 204/298.21, 204/298.22
See application file for complete search history.

(56) References Cited

U.S. PATENT DOCUMENTS

| 5,096,562 | A | * | 3/1992 | Boozenny et al. ....... 204/298.22 |
| 5,527,439 | A | | 6/1996 | Sieck et al. |
| 2006/0049043 | A1 | * | 3/2006 | Matuska et al. ......... 204/298.21 |
| 2008/0128276 | A1 | | 6/2008 | Heinrich et al. |

FOREIGN PATENT DOCUMENTS

| DE | 10 2007 049 73 A1 | 5/2008 |
| EP | 1 584 707 A1 | 1/2005 |

OTHER PUBLICATIONS

Grundwissen des Ingenieurs, Fachbuchverlag, Fachbuchverlag Leipzig 1981, p. 713.

* cited by examiner

*Primary Examiner* — Rodney McDonald
(74) *Attorney, Agent, or Firm* — Heslin Rothenberg Farley & Mesiti P.C.

(57) ABSTRACT

To achieve an improved end block, in which heating by induction eddy currents, which may occur during AC sputtering, for example, is significantly reduced relative to known end blocks, an end block for a magnetron configuration having a rotating target comprises an end block housing having an attachment surface for attaching the end block on a support apparatus, a pivot bearing for rotatable mounting of the rotating target, and at least one current conduction apparatus which conducts current through the end block housing in operation of the end block. The end block housing is implemented so that each current path in the end block housing which encloses the current conduction apparatus has an interruption at least one point.

8 Claims, 1 Drawing Sheet

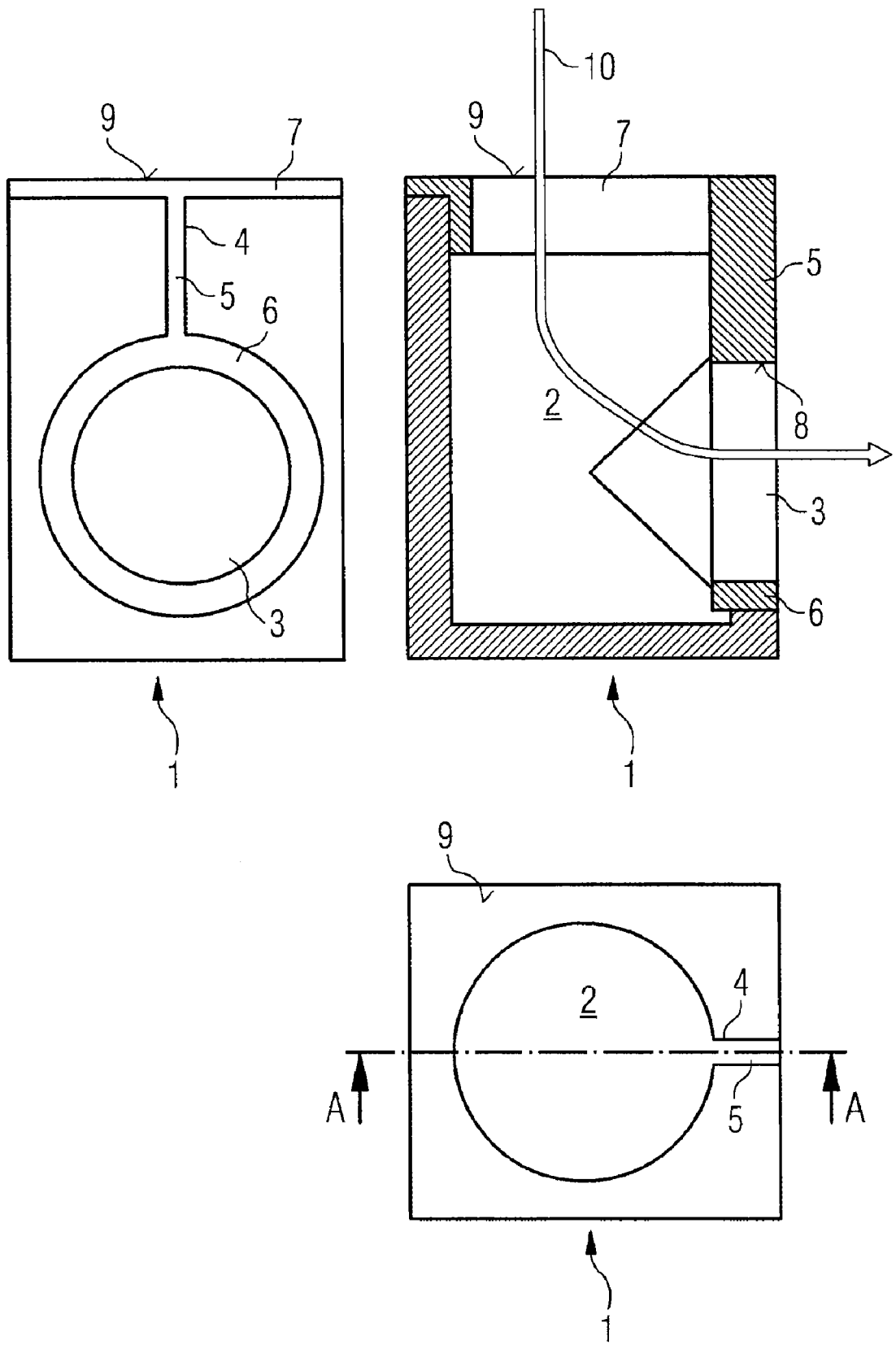

ENDBLOCK FOR A MAGNETRON DEVICE WITH A ROTATABLE TARGET

CROSS REFERENCE TO RELATED APPLICATIONS

This application claims priority of German application No. 10 2008 058 528.9, filed on Nov. 21, 2008, the entire disclosure of which is hereby incorporated herein by reference.

BACKGROUND ART

An end block for a magnetron configuration having a rotating target and a vacuum processing facility having a magnetron configuration of this type are described hereafter, which are constructed simply and are maintenance-friendly.

So-called rotating magnetrons are known in vacuum coating technology, in which a typically tubular target encloses a magnet configuration, the tubular target being mounted so it is rotatable and being drivable so that the target material is ablated uniformly. The tubular target is typically fastened in the vacuum chamber of a vacuum processing facility between two end blocks, which are constructed so that they each allow the rotatable mounting of the tubular target. Different functions are typically assigned to the two end blocks for this purpose. One of the end blocks is typically implemented as a supply end block for supplying a magnetron with cooling water and electrical power and the other end block is implemented as a drive end block for introducing a torque for generating the rotation of the tubular target. End blocks of this type are known, for example, from DE 10 2007 049 735 A1 and WO 2007/147757 A1.

Known end blocks, both supply end blocks and also drive end blocks, are typically connected fixedly to a support apparatus, such as the chamber wall or the chamber cover of a vacuum processing facility, either directly or via a spacer part, which is used for influencing the spacing between magnetron and substrate and is additionally used for the electrical insulation of the end block from the chamber wall or the chamber cover and can be manufactured from an insulating material in this case.

In particular in AC sputtering, heating of the end blocks may arise due to induction eddy currents occurring in the housing of the end block. This heating results in the loss of energy which can no longer be provided to the vacuum process. Furthermore, thermal expansions caused by the heating have unfavorable effects on the magnetron configuration. Moreover, excessively strong heating of the end block can result in damage or even destruction of heat-sensitive components of the end block, such as seals, and thus in the breakdown of the magnetron or the entire vacuum processing facility.

In known end blocks, the heating of the end block occurring in operation is counteracted in that the occurring heat is dissipated by a cooling system integrated in the end block and/or the energy supply is kept low by power limiting. In the first case, an additional cooling apparatus must be provided, which generates additional costs and further increases the energy consumption for operating the vacuum processing facility. In the latter case, in contrast, the performance capability of the magnetron is artificially restricted, whereby the productivity of the vacuum processing facility sinks.

Therefore, an improved end block is to be disclosed, in which the heating by induction eddy currents, which may occur during AC sputtering, for example, is significantly reduced relative to known end blocks.

BRIEF SUMMARY OF INVENTION

Therefore, to achieve the object, an end block for a magnetron configuration having a rotating target is proposed, which comprises an end block housing having an attachment surface for attaching the end block to a support apparatus, having a pivot bearing for the rotatable mounting of the rotating target, and having at least one current conduction apparatus, which conducts current through the end block housing in operation of the end block, the end block housing being implemented so that each current path in the end block housing which encloses the current conduction apparatus has an interruption at at least one point.

The idea on which the proposed end block is based comprises generally implementing the end block housing so that closed current paths in which eddy currents may arise are prevented. For this purpose, it is proposed that insulation sections be incorporated in the geometrical contour of the entire end block. The concrete geometry and implementation of the insulation areas can be very manifold.

In a concrete embodiment, for example, it can be provided that at least the housing wall of the end block housing facing toward the rotating target has a slot extending from the pivot bearing up to the attachment surface.

Furthermore, it can be provided that each interruption is closed by a closure element made of an electrically nonconductive material. The electrically nonconductive material can be a curable casting resin, for example, using which slots or other insulation sections which are used for preventing closed current paths are closed. After the curing of the casting resin, the closure element formed thereby is intimately bonded to the adjoining parts of the end block housing. The end block housing can thus be implemented as vacuum-tight in spite of the provided interruptions.

In a refinement of the proposed end block, the closure element also comprises a ring element which encloses the pivot bearing. According to another refinement of the end block, it is provided that the closure element also comprises an attachment element which forms the attachment surface.

In these refinements, the ring element and/or the attachment element may be produced in the same work step with the closure element and are finally an integrated component of the closure element, if a curable casting resin is used, i.e., they are bonded integrally thereto. The ring element encloses the pivot bearing and provides an electrically nonconductive vacuum-tight surface. In the same way, the attachment element encloses the side of the end block provided for fastening the end block and provides an electrically nonconductive vacuum-tight surface at this point.

BRIEF SUMMARY OF THE DRAWING FIGURES

An exemplary embodiment of the proposed end block is explained in greater detail hereafter on the basis of a FIGURE of a drawing. Single FIG. 1 shows three views of the end block housing.

DETAILED DESCRIPTION

The end block housing 1 has an essentially cuboid basic shape, which is open on one side, having a cylindrical cavity 2. In addition, the external surface pointing toward the target has an opening 3, in which the pivot bearing for a rotating target is situated.

The end block housing 1 is open on top. The end block housing 1 is attached on this side to a support apparatus, such as the chamber wall or the chamber cover of a vacuum processing facility.

A current conduction apparatus, which conducts current through the end block housing 1 in operation of the end block, is situated in the interior for the power supply of the target. This current conduction apparatus can be implemented in greatly varying ways, for example, comprising cable for introducing the current into the end block housing and slip contacts for introducing the current into the rotating target. The concrete embodiment of the current conduction apparatus is unimportant for the idea of the invention, however, because of which the current conduction apparatus is only symbolized in the FIGURE by the arrow 10, which indicates the current flow direction.

In order to prevent closed current paths in the end block housing 1, which enclose the current conduction apparatus and thus result in the generation of eddy currents through induction, the housing wall of the end block housing 1 facing toward the rotating target has a slot 4, which extends from the opening 3 up to the attachment surface 9. This slot acts as an interruption of a possible current path in the end block housing 1.

In order to close the slot 4 and thus make the end block housing 1 vacuum-tight, the slot 4 is subsequently closed using a curable, nonconductive casting resin, which forms the described closure element 5 after the curing. Furthermore, a ring element 6, which encloses the opening 3 and provides an electrically nonconductive vacuum-tight surface 8, and an attachment element 7, which forms the attachment surface 9 of the end block and thus also an electrically nonconductive vacuum-tight surface 9, are formed by the casting resin, which are bonded integrally to the closure element 5.

The invention claimed is:

1. An end block for a magnetron configuration having a rotating target, comprising an end block housing having an attachment surface for attaching the end block to a support apparatus, and walls extending perpendicularly to the attachment surface, a wall facing toward the rotating target having an opening receiving a pivot bearing for rotatable mounting of the rotating target, and at least one current conduction apparatus which conducts current, introduced via the attachment surface, through the end block housing to the rotating target, in operation of the end block, wherein each current path in the end block housing which encloses the current conduction apparatus has an interruption at least one point, and one wall of the walls has a slot extending from a level of the opening up to the attachment surface through a full thickness of the one wall, the slot serving as an interruption.

2. The end block according to claim 1, wherein the one wall comprises the wall facing toward the rotating target.

3. The end block according to claim 2, wherein the slot is closed by a closure element made of an electrically nonconductive material.

4. The end block according to claim 3, wherein the electrically nonconductive material comprises a curable casting resin.

5. The end block according to claim 3, wherein the closure element also comprises a ring element which encloses the pivot bearing.

6. The end block according to claim 5, wherein the closure element also comprises an attachment element which forms the attachment surface.

7. The end block according to claim 6, wherein the ring element and the attachment element are bonded integrally to the closure element closing the slot.

8. The end block according to claim 1, wherein the walls are conductive and each interruption is closed by a closure element made of an electrically nonconductive material.

* * * * *

UNITED STATES PATENT AND TRADEMARK OFFICE
CERTIFICATE OF CORRECTION

| | | |
|---|---|---|
| PATENT NO. | : 8,337,681 B2 | Page 1 of 1 |
| APPLICATION NO. | : 12/621144 | |
| DATED | : December 25, 2012 | |
| INVENTOR(S) | : Heinrich et al. | |

It is certified that error appears in the above-identified patent and that said Letters Patent is hereby corrected as shown below:

On the title page:

In the Assignee (73): Delete "Von Ardenne Anlagentechnik GMGH" and insert --VON ARDENNE Anlagentechnik GmbH--

In the References Cited (56): the German cited reference is incomplete: Delete "DE 10 2007 049 73 A1" and insert --DE 10 2007 049 735 A1--

Signed and Sealed this
Twelfth Day of March, 2013

Teresa Stanek Rea
*Acting Director of the United States Patent and Trademark Office*